US008822309B2

(12) United States Patent
Pan (10) Patent No.: US 8,822,309 B2
(45) Date of Patent: Sep. 2, 2014

(54) HETEROGENEOUS INTEGRATION PROCESS INCORPORATING LAYER TRANSFER IN EPITAXY LEVEL PACKAGING

(71) Applicant: Eric Ting-Shan Pan, Fremont, CA (US)

(72) Inventor: Eric Ting-Shan Pan, Fremont, CA (US)

(73) Assignee: Athenaeum, LLC, Zephyr Cove, NV (US)

( * ) Notice: Subject to any disclaimer, the term of this patent is extended or adjusted under 35 U.S.C. 154(b) by 0 days.

(21) Appl. No.: 13/724,701

(22) Filed: Dec. 21, 2012

(65) Prior Publication Data

US 2013/0161834 A1    Jun. 27, 2013

Related U.S. Application Data

(60) Provisional application No. 61/580,044, filed on Dec. 23, 2011.

(51) Int. Cl.
*H01L 21/30*    (2006.01)

(52) U.S. Cl.
USPC .......................................... 438/458; 257/777

(58) Field of Classification Search
CPC ................... H01L 21/76254; H01L 21/02002; H01L 21/02639
USPC .......................................... 438/458; 257/777
See application file for complete search history.

(56) References Cited

U.S. PATENT DOCUMENTS

| 5,374,564 A | 12/1994 | Bruel |
| 7,557,411 B2 * | 7/2009 | Noguchi et al. ............ 257/347 |
| 7,855,101 B2 | 12/2010 | Furman et al. |
| 7,905,197 B2 | 3/2011 | Pan |
| 7,935,612 B1 | 5/2011 | Bedell et al. |
| 8,193,078 B2 | 6/2012 | Pan |

OTHER PUBLICATIONS

Jokerst, N.M. et al., "The Heterogeneous Integration of Optical Interconnections Into Integrated Microsystems," IEEE Journal of Selected Topics in Quantum Electronics, 9, No. 2, Mar./Apr. 2003, 11 pages.
Bruel, M.; "Silicon on insulator material technology", Electron. Lett. 31, 1201-1202 (1995).
Wanlass, M. et al., "Monolithic, Ultra-Thin GaInP/GaAs/GaInAsTandem Solar Cells," NREL/PR-520-39852, Presented at the 2006 IEEE 4th World Conference on Photovoltaic Energy Conversion (WCPEC-4) held May 7-12, 2006 in Waikoloa, Hawaii, 4 pages.
Kub, Fritz J. et al.; "Ultra-Thin Silicon Complaint Layers for Infrared Materials," Naval Research Laboratory/OMB 0704-0188, 1998, 8 pages.
Goorsky, M.S. et al.; "Engineered Layer Transfer Substrates for Heterogeneous Integration of III-V Compound Semiconductors," 2008 The International Conference on Compound Semiconductor Manufacturing Technology, 4 pages.

(Continued)

*Primary Examiner* — Tu-Tu Ho
(74) *Attorney, Agent, or Firm* — J. Nicholas Gross (57) ABSTRACT

Methods and structures for heterogeneous integration of diverse material systems and device technologies onto a single substrate incorporate layer transfer techniques into an epitaxy level packaging process. A planar substrate surface of multiple epitaxial areas of different materials can be heterogeneously integrated with a substrate material. Complex assembly and lattice engineering is significantly reduced. Microsystems of different circuits made from different materials can be built from a single wafer Fab line employing the claimed processes.

5 Claims, 7 Drawing Sheets

(56) References Cited

OTHER PUBLICATIONS

Brendel, Rolf; "Crystalline thin-film silicon solar cells from layer transfer processes: a review," Proc.10th Workshop on Crystalline Silicon Solar Cell Materials and Processes, Aug. 13-16, 2000, Copper Mountain, USA, 9 pages.

Voncken, M. M. A. J. et al.; "Etching AlAs with HF for Epitaxial Lift-Off Applications," Journal of the Electrochemical Society, 151, No. 5 (2004): G347-G352.

Archer, M.J. et al.; "Materials Processes for Ultrahigh Efficiency Lattice Mismatched Multijunction Solar Cells," SPIE Optics+Photonics (2007): 6649-14, 22 pages.

Lee, X. Y. et al.; "Thin Film GaAs Solar Cells on Glass Substrates by Epitaxial Liftoff," National renewable energy laboratory and sandia national laboratories photovoltaics program review meeting. AIP Conference Proceedings, 394, (1997): 719-727.

Gosele, U. et al.; "Fundamental Issues in Wafer Bonding," Journal of Vacuum Science and Technology A, 17(4), Jul./Aug. 1999, 8 pages.

\* cited by examiner

HETEROGENEOUS INTEGRATION PROCESS INCORPORATING LAYER TRANSFER IN EPITAXY LEVEL PACKAGING

RELATED APPLICATION DATA

The present application claims the benefit under 35 U.S.C. §119(e) of the priority date of Provisional Application Ser. No. 61/580044 filed Dec. 23, 2011 which is hereby incorporated by reference.

FIELD OF THE INVENTION

The present invention relates to structures and methods of heterogeneous integration of diverse material systems and device technologies onto a single substrate in the fields of semiconductors and related heterogeneous integration among microelectronics, optoelectronics, electromechanics, thermoelectrics, photovoltaics, thermo-photovoltaics, electrochemical, photo-electrochemical, piezoelectrics, superconductors, etc.

BACKGROUND

The following documents are incorporated by reference herein:
1. M. Bruel, "A new silicon on insulator material technology", Electron. Lett. 31, 1201-1202 (1995).
2. U.S. Pat. No. 5,374,564 M. Bruel
3. M. Wanlass et al., "Monolithic, Ultra-Thin GaInP/GaAs/GaInAsTandem Solar Cells," NREL/PR-520-39852, Presented at the 2006 IEEE 4th World Conference on Photovoltaic Energy Conversion (WCPEC-4) held May 7-12, 2006 in Waikoloa, Hi.
4. F. J. Kub et al., "Ultra-Thin Silicon Complaint Layers for Infrared Materials," Naval Research Laboratory/OMB 0704-0188, 1998.
5. M. S. Goorsky et al., "Engineered Layer Transfer Substrates for Heterogeneous Integration of III-V Compound Semiconductors," 2008 The International Conference on Compound Semiconductor Manufacturing Technology.
6. R. Brendel, "Crystalline thin-film silicon solar cells from layer-transfer processes: a review," Proc. 10th Workshop on Crystalline Silicon Solar Cell Materials and Processes, Aug. 13-16, 2000, Copper Mountain, USA.
7. U.S. Pat. No. 7,855,101 B. K. Furman et al.
8. M. M. A. J. Voncken et al., "Etching AlAs with HF for Epitaxial Lift-Off Applications," Journal of the Electrochemical Society, 151, no 5 (2004): G347-G352.
9. N. M. Jokerst et al., "The Heterogeneous Integration of Optical Interconnections Into Integrated Microsystems," IEEE JOURNAL OF SELECTED TOPICS IN QUANTUM ELECTRONICS, 9, no. 2, MARCH/APRIL 2003.
10 X. Y. Lee et al., "Thin Film GaAs Solar Cells on Glass Substrates by Epitaxial Liftoff," National renewable energy laboratory and sandia national laboratories photovoltaics program review meeting. AIP Conference Proceedings, 394, (1997): 719-727.
11. M. J. Archer et al., "Materials Processes for Ultrahigh Efficiency Lattice Mismatched Multijunction Solar Cells," SPIE Optics+Photonics (2007): 6649-14.
12. U.S. Pat. No. 7,935,612 S. Bedell et al.
13. U.S. Pat. No. 7,905,197 E. T -S. Pan
14. U.S. Pat. No, 8,193,078 E. T -S. Pan
15. U. Gosele et al., "Fundamental Issues in Wafer Bonding," JOURNAL OF VACUUM SCIENCE AND TECHNOLOGY A, 17(4), July/August 1999.

Prior art layer transfer methods typically separate grown epitaxy layer(s) or finished device structure from a parent wafer substrate to a daughter substrate. The different types of prior art processes typically practiced as follows:

1) Commonly known as Ion Cut or Smart Cut—cleave fine monocrystalline layers by inducing, through ion implantation to create a mechanically weak zone below the surface of the donor wafer. The implanted wafer is then bonded to a handle wafer and the obtained pair is subjected to thermal annealing to produce voids and extended internal surfaces in terms of pressurized microcracks parallel to the bonding interface. This leads to the splitting and transfer of a thin monocrystalline layer with a thickness roughly equivalent to the implantation depth (see references #1, #2 above).

2) Deposit a backside contact and back surface reflector atop an inverted tandem structure which is grown on an etch stop layer over a first substrate. Mount the inverted tandem structure upside down on a second substrate. Remove the etch stop layer and thus the first substrate. Complete frontside processing of the tandem structure on the second substrate (see reference #3).

3) Deposit some layers on a first substrate, and other layers on a second substrate. Polish and bond the two-layered substrates by annealing. Detach the second substrate by a hydrogen implantation, leaving the desired layer combination on the first substrate (see references #4, #5).

4) Prepare a surface layer (surface conditioning) on a silicon substrate. Grow a device layer on the surface treated layer. Attach a carrier to the device layer. Remove the surface layer and the silicon substrate (see reference #6).

5 Build a semiconductor device layer on a first substrate. Provide a set of first functional elements to connect in the semiconductor device layer. Attach a carrier substrate on top of the first functional elements. Remove the first substrate to expose the bottom side of the semiconductor device layer producing a first intermediate structure. Build a set of second functional elements on a foundation substrate to produce a second intermediate structure. Bond the first and the second intermediate structures to form a third intermediate structure. Remove the carrier substrate. Provide input output means on the exposed surface of the first functional elements to form the integrated device structure (see reference #7).

6) An epitaxial lift-off process allows the separation of a thin layer of compound semiconductor material from a substrate by strain-accelerated selective etching of an intermediate or sacrificial layer. Other means of removing the sacrificial layer in ELO include laser-assisted lift-off, ion bombardment (see reference #8).

7) Fabricate devices on an etch stop layer (epitaxial surface) grown on a substrate. Mesa etch to etch stop layer and pattern separate devices. Remove the substrate using selective wet etching. Bond the device onto a host substrate using a transfer diaphragm (see reference #9).

8) Wax the top of a device. Lift-off in a selective chemical etch of a sacrificial layer and remove the substrate. Attach the lift-off device to a glass substrate. Remove wax in chemical removal step (see reference #10).

9) Implant a device template substrate. Activate and clean the surface of the device template substrate and the handle substrate. Initiate a bond at room temperature. Apply uniform pressure and heat to the stacked wafers to strengthen the bond and initiate exfoliation (see reference #11).

10) Form an upper silicon (Si) layer over a boron-doped SiGe layer. Hydrogenate the boron-doped SiGe layer by hydrogen plasma without ion implantation. Bond the upper Si layer to an alternate substrate and propagate a fracture at an interface between the boron-doped SiGe layer and the bulk silicon substrate (see reference #12).

Other improved processes are shown in references #13 and #14 above to the instant inventor. There is still a need for further improvements in this field.

SUMMARY OF THE INVENTION

An object of the present invention, therefore, is to overcome the aforementioned limitations of the prior art. It will be understood from the Detailed Description that the inventions can be implemented in a multitude of different embodiments. Furthermore, it will be readily appreciated by skilled artisans that such different embodiments will likely include only one or more of the aforementioned objects of the present inventions. Thus, the absence of one or more of such characteristics in any particular embodiment should not be construed as limiting the scope of the present inventions.

The present disclosure describes a plurality of embodiments applying layer transfer (e.g. ion-induced exfoliation) techniques to an epitaxy-level packaging (ELP) method (see reference #13, #14) of epitaxial layer growth from a crystalline parent substrate into through-substrate vias to form epitaxial islands (or pillars) in an assembly daughter substrate to provide a wafer substrate as a common substrate platform for further wafer fabrication to achieve heterogeneous integration. There are two insertion points to incorporate layer transfer into the ELP process—before and after epitaxial island growth.

From the perspectives of material, processing, and assembly, ELP makes efficient use of compound semiconductor material by growing islands/pillars rather than wafers, and has the ability to integrate several different materials on the same wafer platform (e.g. silicon) using existing wafer fabrication processes. Wafer level heterogeneous integration is readily achievable by selective masking and demasking of ELP islands and Si area by either fabricating each microsystem sequentially or fabricating multiple microsystems by inserting modular steps of one microsystem into the flow of another microsystem at appropriate steps while preserving the electrical integrity of all microsystems.

Aspects of the invention extend the ELP method into semiconductor wafer fabrication process flow for heterogeneous integration of one or more compound semiconductor (CS) materials in the form of multiple ELP homoepitaxy areas that are on the same planar surface as the surface or sub-surface of assembly substrate (e.g. made of silicon with an oxidized layer). Devices and ICs can be built from a single wafer fabrication line with interconnects among a diversity of devices made out of different materials.

A first aspect of the invention concerns methods of forming epitaxial structures, in which an exfoliation takes place in a crystalline substrate prior to using an assembly substrate to create an epitaxial pattern. A handling substrate is employed to assist in separating a recrystallized exfoliation layer from the crystalline substrate.

A second aspect of the invention concerns methods of forming epitaxial structures, in which an exfoliation takes place in an assembly substrate after an epitaxial layer/pattern has been formed. A handling substrate is employed to assist in separating a recrystallized exfoliation layer from the assembly substrate. Additional processing can be performed in some applications to split/divide the assembly substrate into two distinct halves which can be further processed.

A third aspect of the invention concerns methods of forming epitaxial structures, in which an exfoliation takes place during a time that an epitaxial layer/pattern is being formed in an assembly substrate.

Additional aspects of the invention are directed to the resulting structures from the aforementioned processes, including an epitaxial structure formed in an assembly substrate that includes an ion implanted exfoliation layer. Other aspects concern assembly substrates which include different types of epitaxial material in different regions, thus allowing heterogeneous integration of different microsystems.

DETAILED DESCRIPTION

As discussed in the background of this invention, there are a number of methods to achieve layer transfer. All layer transfer methods involve a sacrificial layer or a separation layer. Ion-induced exfoliation is one of the most widely adapted layer transfer method in the industry and can be applied to a variety of crystalline materials. For illustration purpose in the FIGS. 1A-F and 2A-B, ion-induced exfoliation is used as the layer transfer technique for ELP wafer formation. Other applicable layer transfer techniques may also be used in place of ion-induced exfoliation.

Figure 1A:
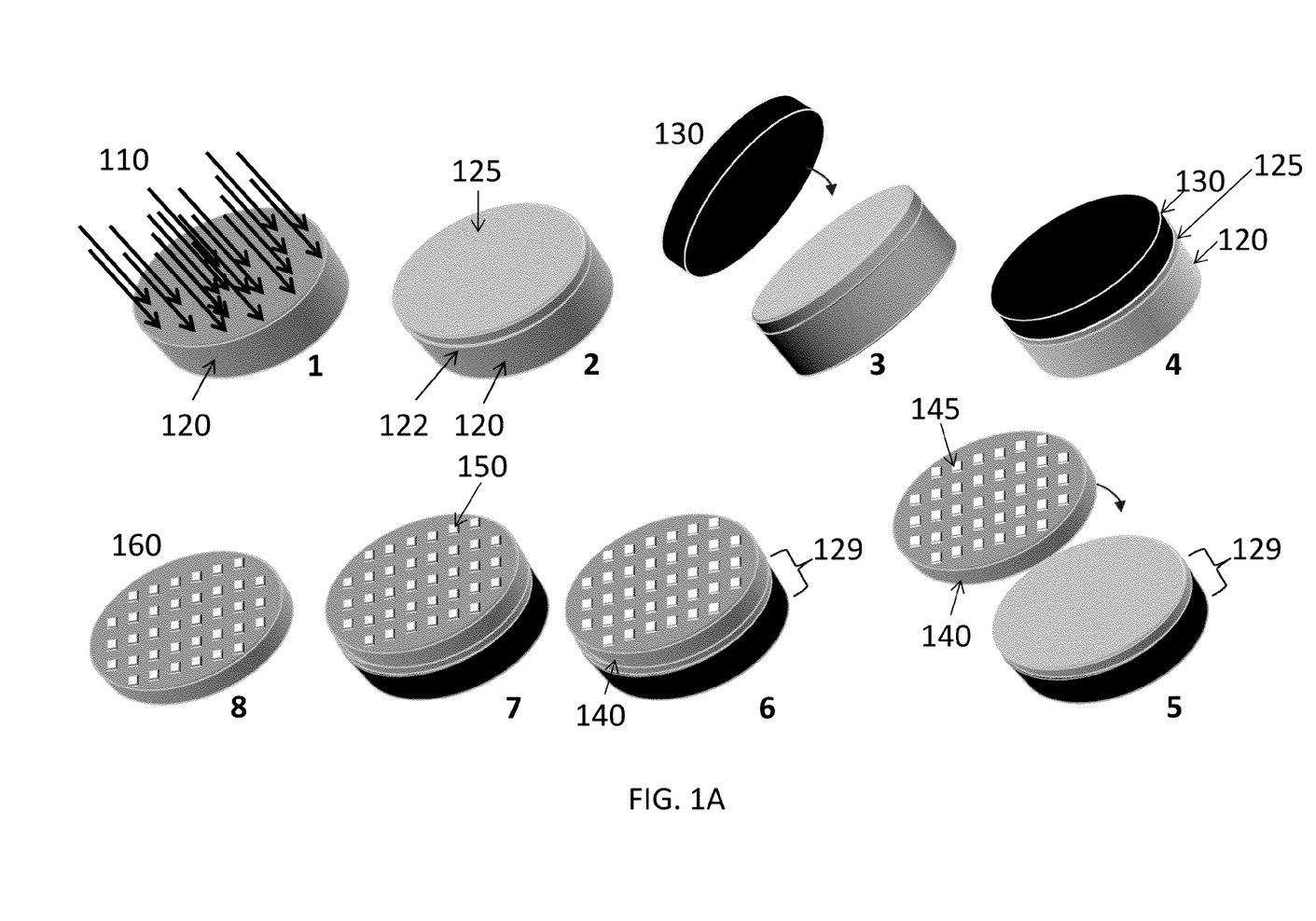
FIG. 1A illustrates a preferred embodiment of a method of applying layer transfer before ELP epitaxial island/pillar growth.

In FIG. 1A, Inset 1 shows that an ion beam flux 110 irradiates (i.e. causes ion implantation) unto a preferably bare crystalline substrate 120 (although it will be understood that other materials that do not interfere with the process could be on the surface). The ion beam flux 110 is generally defined by its ion species, dose (ions/area), and energy. For ion-induced exfoliation, substrate temperature and ion beam incident angle during ion implantation also influence the degree of exfoliation.

Ion implantation preferably creates an interfacial plane 122 of ion-induced damages to the crystalline structure at a certain target depth below the surface of crystalline substrate 120 (Inset 2). The volume between the interfacial plane 122 and the surface of the crystalline substrate defines a thin layer 125 to be exfoliated or separated from the crystalline substrate.

A separate handling substrate 130 is preferably used to bond to the ion implanted surface of the crystalline substrate 120 (Insets 3) before layer transfer (exfoliation) by annealing (Inset 4). In some embodiments, it may be possible to grow handling substrate directly on (at least portions of) substrate 120. During annealing, implanted ions are released from the trapping sites and accumulate on platelets formed during implantation. Due to an increase of inner pressure, platelets grow and overlap, eventually leading to the formation of microcavities following a path parallel to the substrate surface. Gas-containing microcavities gradually grow and an interaction between neighboring microcavities occur and result in the propagation of a crack along the cavity plane. An optimal range of ion implantation temperature can be used for controlled formation of platelets.

In preparation for layer transfer, the surfaces of layer 125 and handling substrate 130 should preferably be chemically conditioned (reference #15) and cleaned before bonding for exfoliation. Bonding or adhesion can be initiated by bringing the two surfaces in contact with each other through applying localized pressure. Actual bonding is achieved by van der Waals interactions. Control of post-implant annealing temperature at a lower temperature (typically less than 300° C.) and conditions is important for layer separation from the interfacial plane 122, especially for layer transfer between dissimilar materials with very different thermal expansion coefficients. The sequence of actions preferably leads to layer separation in direction parallel to the bonded surface and completes the transfer of layer 125 from the crystalline substrate 120 to the handling substrate 130 (Inset 5). Other techniques known in the art or later developed and which are consistent with the present teachings can be employed to effectuate exfoliation.

The transferred thin layer 125 may then be polished for planarization and preferably annealed for repairing implant damages, recrystallization, and/or dopant activation to prepare a crystalline template 129. An assembly substrate 140 (preferably a silicon based material but including compositions such as SiC, $SiO_2$, $Si_3N_4$, and similar oxide and non-oxide ceramics or glasses) having desired etching or patterning profile including through-substrate vias 145 is pressed against (preferably without atomic bonding to) thin layer 125 which is bonded to a handling substrate 130 in an epitaxial growth apparatus (Inset 6). As epitaxial layer grows from the surface of crystalline layer 125 at the bottom of through-substrate vias 145 within the assembly substrate 140, grown epitaxial layer eventually fills up through-substrate vias to form epitaxial islands/pillars 150 (Inset 7). After epitaxial layer growth, handling substrate 130 may be debonded from layer 125. Layer 125 may also be removed or further thinned down by standard planarization techniques such as Chemical Mechanical Planarization (CMP) to complete the ELP substrate 160 (Inset 8).

Figure 1B:
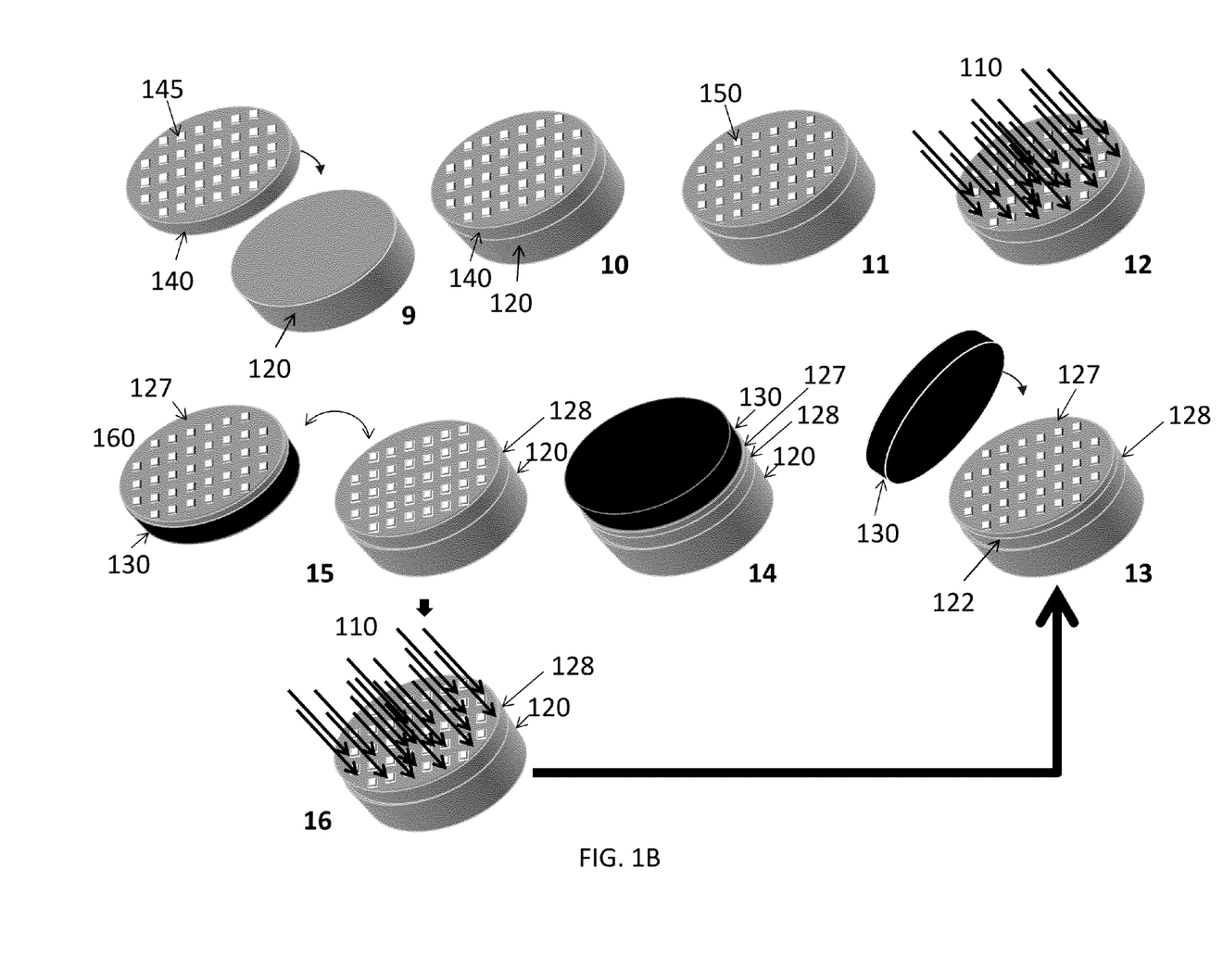
FIG. 1B illustrates a preferred embodiment of a method of applying layer transfer after ELP epitaxial island/pillar growth.

FIG. 1B describes an embodiment of making ELP substrate 160 (Inset 15) having a layer transfer after epitaxial layer growth. Crystalline substrate 120 and the assembly substrate 140 having an epitaxial pattern, including a desired etch profile and through-substrate vias 145 (Inset 9) are pressed against each other preferably without atomic bonding (Inset 10) for epitaxial island 150 growth filling up through-substrate vias (Inset 11). An ion beam flux 110 irradiates (i.e. ion implantation) unto the assembly substrate 140 and epitaxial islands 150 for ion-induced exfoliation (Inset 12). Basically an exfoliation depth is dependent upon the mass and energy of the ion and the atomic density of the target material. In case of ion-induced exfoliation of a heterogeneous layer consisting of two or more different materials, creating a uniform exfoliation plane at the same depth across different materials has challenges but can be achieved by two approaches.

Figure 1C:
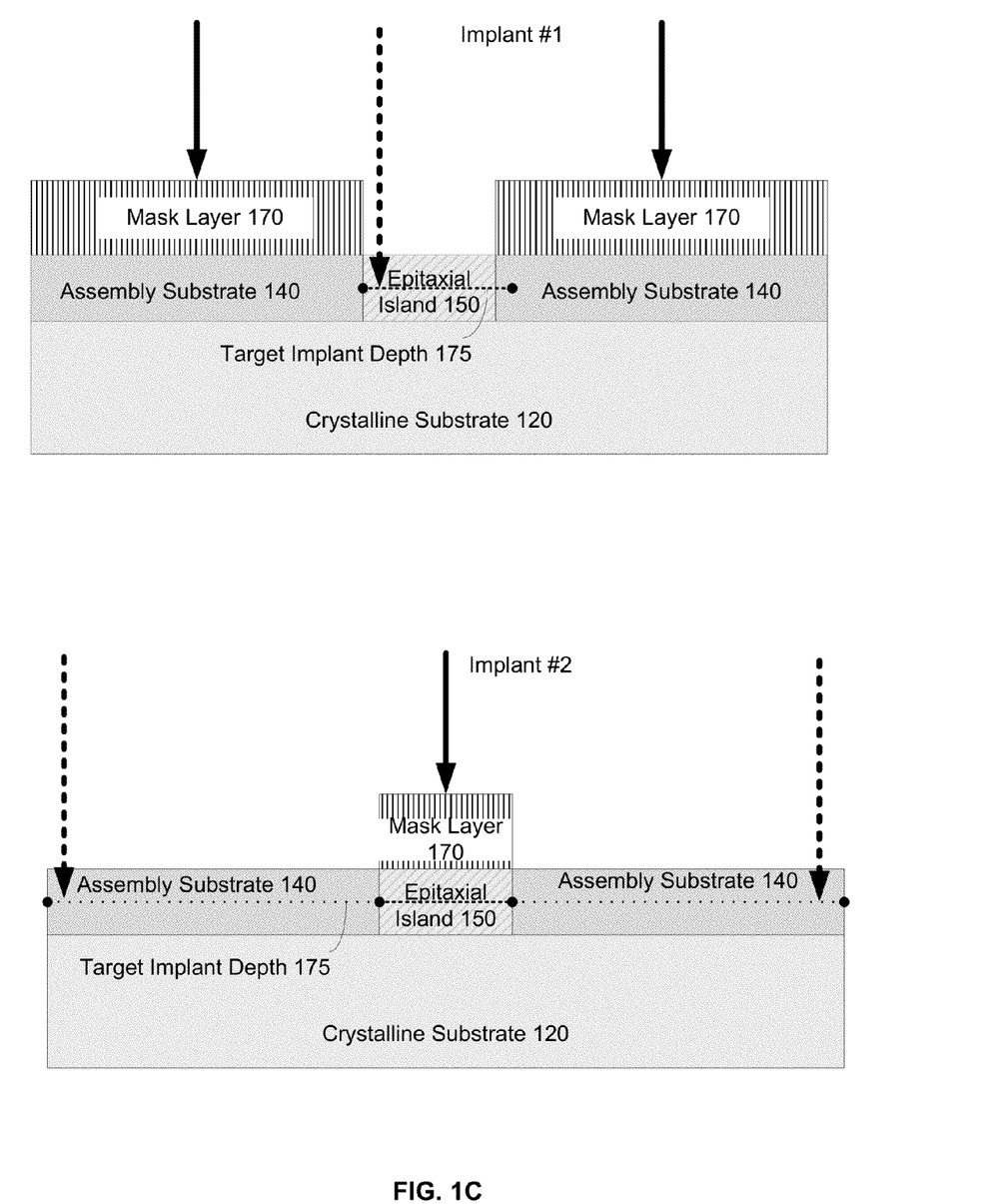
FIG. 1C illustrates an approach of a selective ion implant to create a uniform exfoliation plane at the same depth across different materials.

One approach—shown in FIG. 1C—is to perform selective ion implantation where different materials (i.e. epitaxial islands and assembly substrate) receive ion implantation of different conditions at selective areas through multiple masking and demasking steps. Thus, two separate implants could be performed to achieve a reasonably consistent target demarcation depth/size for the exfoliation layer.

Figure 1D:
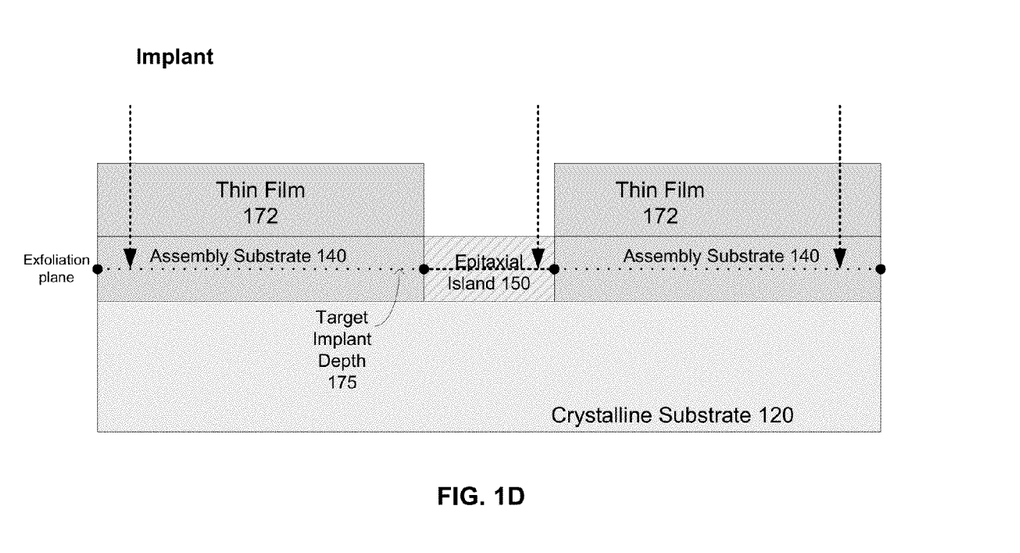
FIG. 1D illustrates another approach of blanket ion implant with compensating thin film to create a uniform exfoliation plane at the same depth across different materials.
Figure 1E:
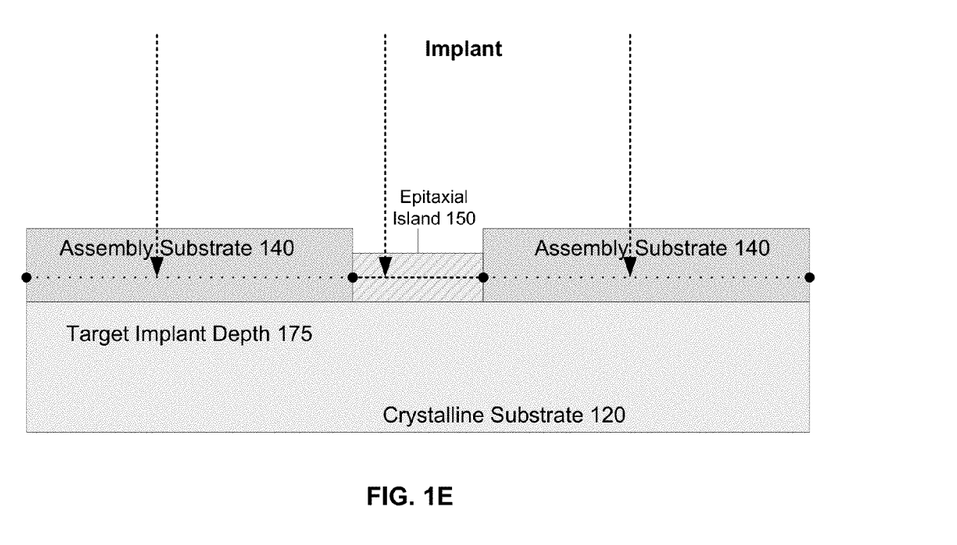
FIG. 1E illustrates yet another approach of blanket ion implant with compensating etching to create a uniform exfoliation plane at the same depth across different materials.

Another approach—as shown in FIGS. 1D/1E—compensates uniformity of exfoliation depth by depositing a thin film over or etching off for each material such that the same ion implantation conditions can be preferably applied over the entire assembly substrate and the epitaxial islands at the same time (i.e., blanket ion implantation). It will be understood that the relative thicknesses shown in FIGS. 1D/1E of the layers, masks, etc. are only intended to be illustrative and are not drawn to scale. They will vary in accordance with a density, composition of the materials used for the assembly substrate and the epitaxial layer. Moreover the use of the thin film is shown to be used to mask the assembly substrate, but in any final implementation this may vary in accordance with the particular assembly substrate and epitaxial materials used.

After ion implantation is achieved and a uniform exfoliation plane 122 is formed, a handling substrate 130 is preferably bonded to the transferring layer 127 above the exfoliation plane 122 (Insets 13, 14). Ion-induced exfoliation is accomplished by annealing thus preferably leaving two separate halves or composites (Inset 15). The first composite is the ELP substrate 160 consisting of the transferred layer 127 that is planarized, annealed for repairing implant damages, and bonded to handling substrate 130. The second composite consists of remaining layer 128 attached to the crystalline substrate 120. In case of heterogeneous epitaxial islands/pillars, crystalline substrate 120 may consist of multiple crystalline substrate pieces. The second composite may be ion implanted (Inset 16) for another ion-induced exfoliation (repeating the process in Insets 13-16 in one or more times to produce multiple ELP substrates).

Figure 1F:
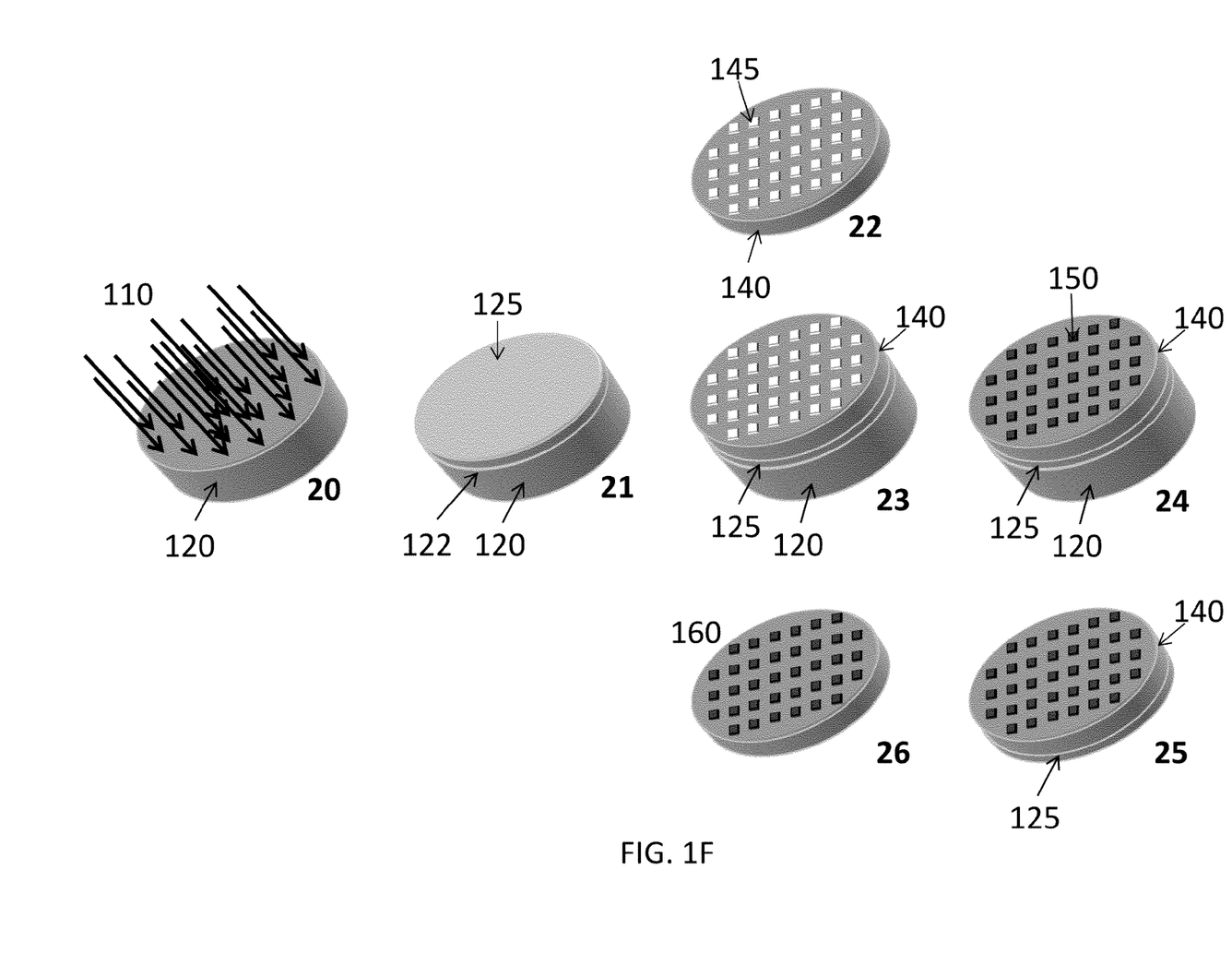
FIG. 1F illustrates a preferred embodiment of a method of applying layer transfer with ion implantation before ELP epitaxial island growth and with exfoliation after ELP epitaxial island growth.

FIG. 1F describes yet another embodiment of an in-situ epitaxial island/pillar growth and layer separation. The crystalline substrate 120 is implanted with an ion flux 110 (Inset 20) preferably creating a thin layer 125 to be exfoliated or separated from the crystalline substrate 120 at the interfacial plane 122 (Inset 21). The assembly substrate 140 with through substrate vias 145 (Inset 22) is brought into contact (preferably with no atomic bonding) onto the surface of the thin layer 125 un-separated from its crystalline substrate 120 (Inset 23) and be put into an epitaxial layer growth apparatus. By choosing an ion species (for example, H, He or N) and optimizing among implant conditions and processing temperatures at various steps (i.e. recrystallization, epitaxial layer growth, and exfoliation), an in-situ process (within the epitaxial layer growth apparatus) can be achieved such that recrystallization of layer 125 can be performed first at a temperature preferably lower than the peak temperatures of epitaxial growth and exfoliation.

Then an epitaxial layer growth filling out the through substrate vias 145 to form epitaxial islands or pillars 150 can be carried out preferably at a temperature-duration profile that does not initiate exfoliation (Inset 24). Exfoliation can be performed preferably at the end of epitaxial island growth in-situ or ex-situ to remove crystalline substrate 120 (Inset 25).

Further processing to remove thin layer 125 may be performed to form the ELP substrate 160 (Inset 26). Exfoliation of the thin layer 125 from the crystalline substrate 120 and removal of the thin layer 125 may also be performed during or after the formation of microsystems (not shown in FIG. 1F). The thin layer 125 may also be formed without ion implantation and be removed by preferential chemical etching.

Furthermore, in this embodiment exfoliation of crystalline substrate can also occur before or contemporaneous with epitaxial growth. Because the crystalline substrate 120 is physically confined in a holding apparatus (not shown) the separated exfoliated top layer from crystalline substrate stays in place for subsequent epitaxial growth. As epitaxial layer growth is completed, the ELP wafer is completed with epitaxial islands or pillars and separated from the crystalline substrate in one step. The ELP wafer is passed to device epitaxial structure growth and wafer fabrication.

Figure 2A:
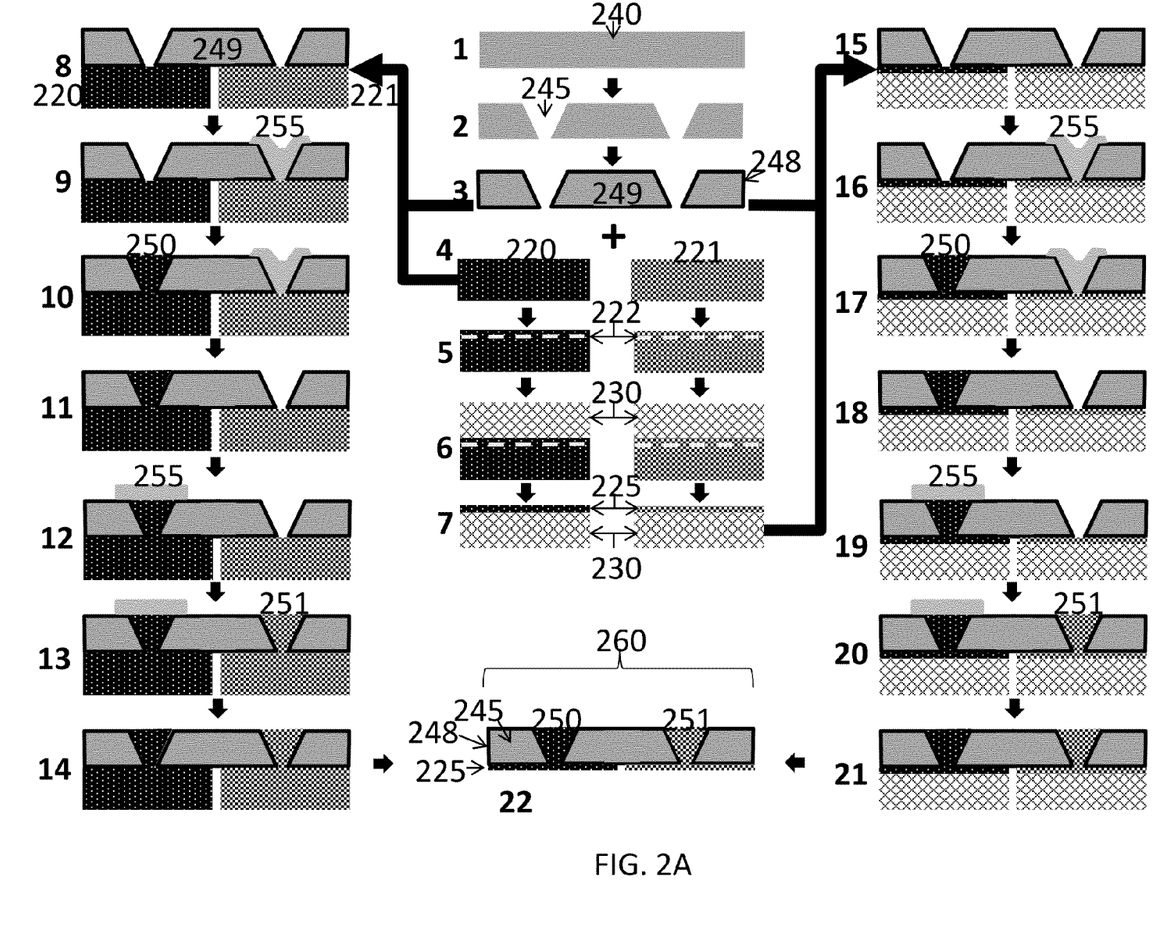
FIG. 2A illustrates a preferred embodiment of a process flow for making an ELP wafer substrate incorporating layer transfer.

FIG. 2A shows a preferred process flow of making ELP wafer substrate incorporating layer transfer in cross sectional diagrams. It starts with an assembly substrate 240 (Inset 1) which preferably can be etched to include a pattern with any desired etch profile including through substrate vias 245 (Inset 2). The entire etched assembly substrate with through substrate vias can be coated preferably with one or more interfacial layers 248 (Inset 3) by appropriate techniques such as thin film deposition or coating, oxidation, nitridation, etc. The purpose of the interfacial layer(s) 248 is twofold: first to provide an inert surface void of defects and crystal grains in through substrate vias 245 so that the surface does not impede epitaxial crystal growth within the through substrate vias 245; and second to provide better Coefficient of Thermal Expansion (CTE) match between the assembly substrate 240 and epitaxial islands 250 and 251 to be grown. The specific composition, thickness, etc. of the interfacial layers 248 can be selected based on routine testing and optimization.

One or more crystalline substrates 220 and 221 (Inset 4) may be used preferably to provide templates for homoepitaxy island growth. The crystalline substrates 220 and 221 (Inset 4) can be combined with etched and coated assembly substrate 249 (Insets 3 and 8) where crystalline substrates are not atomic bonded to the etched and coated assembly substrate but are preferably mechanically pressed or held in physical contact using any conventional means against each other (Inset 8).

For ELP epitaxial island/pillar growth of two or more different crystalline materials, selective masking enables epitaxial island/pillar growth of one material at a time. Thus in Inset 9, a masking layer 255 is applied to cover through substrate via 245 over the crystalline substrate(s) 221. The masking layer 255 preferably can be photoresist or another material that can be made as a mask and is easily removable. With the vias covered over crystalline(s) 221, epitaxial islands 250 can be grown over crystalline(s) 220 (Inset 10). After the completion of epitaxial islands/pillars 250, the masking layer 255 can be removed (Inset 11).

To prepare epitaxial island/pillar growth over crystalline substrate(s) 221, preferably a masking layer 255 can be applied over grown epitaxial islands/pillars 250 (Inset 12). The masking layer 255 can be over the etched and coated assembly substrate 249 and previously formed epitaxial islands/pillars. Once the first grown epitaxial islands/pillars 250 are masked or protected, a group of second epitaxial islands/pillars 251 can be grown over crystalline substrate(s) 221 (Inset 13).

After the completion of epitaxial islands 251, masking layer 255 can be removed (Inset 14). Crystalline substrates 220 and 221 may be thinned down or completely removed to form an ELP substrate 260 (Inset 22).

As shown in Inset 5, as an alternative, layer transfer may be performed on crystalline substrates 220 and 221 before epitaxial island growth. An exfoliation plane 222 preferably can be created within the crystalline substrates 220, 221 by any suitable layer transfer technique such as ion implantation as discussed above (Inset 5). Handling substrates 230 are preferably bonded to a top surface of transferring layer (Inset 6) using any number of known techniques. By annealing or other appropriate techniques to initiate layer exfoliation along the exfoliation plane 222, transferred layers 225 are left bonded to handling substrates 230 (Inset 7). Insets 15 to 21 correspond to the same process sequence as described in Insets 8 to 14. At the completion of epitaxial island growth 250 and 251 (Inset 21), the handling substrates 230 preferably can be removed from the transferred layer 225 to form the ELP substrate 260 (Inset 22).

Figure 2B:
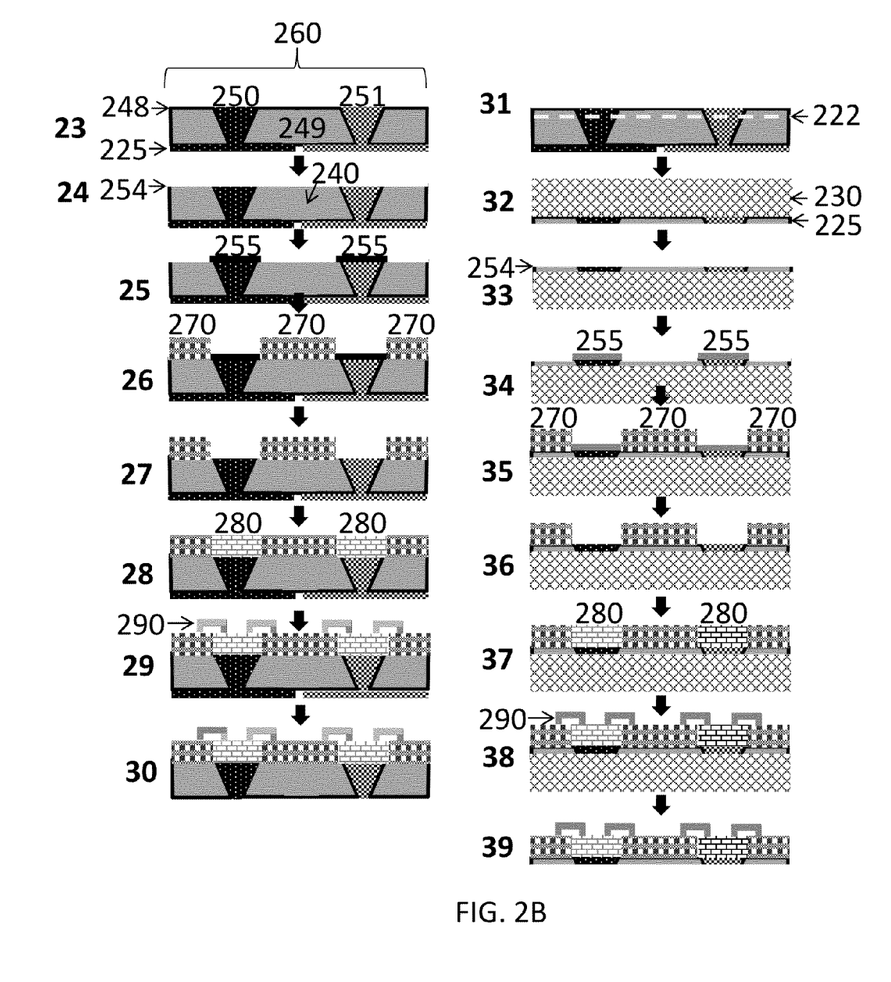
FIG. 2B illustrates a preferred embodiment of a process flow using an ELP wafer substrate for heterogeneous integration incorporating layer transfer.

FIG. 2B is an illustration of an alternative process flow using ELP wafer substrate for heterogeneous integration incorporating layer transfer after epitaxial island growth. Inset 23 in FIG. 2B corresponds to Inset 22 in FIG. 2A. The ELP substrate 260 consists of etched and coated assembly substrate 249, thinned or layer transferred crystalline layer 225, and grown epitaxial islands 250 and 251 made of one or more materials. The crystalline layer 225 may be completely removed. For heterogeneous integration of devices built on epitaxial islands 250 and 251 and devices built on the material of assembly substrate 240, the coated layer 248 preferably may be removed to leave an uncoated surface 254 (Inset 24 for further device fabrication and circuit integration.

From the perspectives of material, processing, and assembly, ELP makes efficient use of compound semiconductor material by growing islands or pillars which can be interconnected—rather than wafers—and has the ability to integrate several different materials on the same assembly substrate platform (e.g. silicon) using existing wafer fabrication processes. Wafer level heterogeneous integration is readily achievable by selective masking and demasking of ELP islands and assembly substrate area by either fabricating each microsystem sequentially or fabricating multiple microsystems by inserting modular steps of one microsystem into the flow of another microsystem at appropriate steps while preserving the electrical integrity of all microsystems.

In FIG. 2B, the sequence of fabricating microsystems serves as an illustration only and can be changed depending on critical process parameters among the microsystems. A straightforward heterogeneous process integration approach is to first preferably fabricate key step(s) requiring high temperature followed by building individual microsystems by masking or unmasking ELP islands, and finishing by deposition of interconnects (e.g. copper and/or carbon nanotube) between microsystems. Other considerations may include photolithographic resolution, layer step coverage, etch stop control, and so on in a three-dimensional (3D) circuit topology.

Herein, the sequence begins with fabricating devices and a microsystem built on the material of an assembly substrate first and then later on epitaxial islands/pillars. In Inset 25, a masking layer 255 is preferably coated on the surface of epitaxial islands 250 and 251. Microsystem 270 is then preferably grown in a selected pattern based on mask 255 and consists of an electrical network of active devices, passive elements as resistors, inductors, and capacitors, transmission lines, voltage and current sources, switches, resonators, etc. that are fabricated on assembly substrate material 240 (Inset 26).

By removing masking layer 255 from the surface of epitaxial islands/pillars 250 and 251 (Inset 27), additional microsystems 280 can be fabricated on the epitaxial islands 250 and 251 (Inset 28). Interconnects (with or without final passivation) 290 are formed to preferably connect microsystems 270 and 280 (Inset 29) to complete heterogeneous integration. The thin bottom crystalline layer 225 may be removed and planarized at the end of fabrication (Inset 30).

As used herein a "microsystem" refers to a combination of different microdevices made from or on a single semiconductor material. For example, microsystem 270 can represent a collection of silicon integrated circuits and microsystem 280 can represent devices made from or on one or more compound semiconductors. For example, one could be a GaAs-based radio frequency integrated circuits and another could be GaN-based radio frequency integrated circuits or optical waveguide couplers, or InP-based photonic circuits, etc.

As an alternative a layer transfer as described in FIG. 1B may be performed on the ELP substrate 260 preferably creating a uniform exfoliation plane 222 (Inset 31) within the assembly substrate and epitaxial islands. A handling substrate 230 is preferably bonded to the top surface of transferring layer 225. Annealing or other applicable techniques is preferably applied to initiate exfoliation along the exfoliation plane 222. Insets 33 to 38 follow the same descriptions as Insets 24 to 29, to create two separate but interconnected microsystems. At the completion of heterogeneous integration, the handling substrate 230 may be removed (Inset 39).

It will be apparent to those skilled in the art that the above is not intended to be an exhaustive description of every embodiment which can be rendered in accordance with the present teachings. Other embodiments could be constructed which use a combination of features from the above described exemplary forms.

Accordingly the present disclosure will be understood by skilled artisans to describe and enable a number of such variants as well

What is claimed is:

1. A method of forming an epitaxial structure comprising:
   implanting an ion species suitable for exfoliation into a crystalline substrate to form an ion implanted exfoliation layer in said crystalline substrate;
   bonding a handling substrate to said ion implanted exfoliation layer;
   separating said handling substrate and ion implanted exfoliation layer from said crystalline substrate;
   mounting an assembly substrate over said ion implanted exfoliation layer;
   wherein said assembly substrate includes a number of apertures extending therethrough forming an assembly pattern;
   growing an epitaxial material within said assembly pattern to form an epitaxial pattern over said ion implanted and recrystallized exfoliation layer.

2. The method of claim 1 wherein said handling substrate is a separate substrate bonded to said ion implanted exfoliation layer.

3. The method of claim 1 further including a step: separating said assembly substrate containing said epitaxial pattern from said ion implanted and recrystallized exfoliation layer.

4. The method of claim 1 further including a step: forming an interfacial layer over said assembly substrate.

5. The method of claim 1 further including a step: masking said assembly substrate so that said epitaxial pattern includes at least two separate types of epitaxial material in said apertures.

* * * * *